(12) United States Patent
Kim et al.

(10) Patent No.: US 7,220,173 B2
(45) Date of Patent: May 22, 2007

(54) WAFER HOLDER AND WAFER CONVEYOR SYSTEM EQUIPPED WITH THE SAME

(75) Inventors: Tae-Kyoung Kim, Yongin-si (KR); Yun-Jung Jee, Yongin-si (KR); Kyoung-Su Shin, Suwon-si (KR); Chung-Sam Jun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 116 days.

(21) Appl. No.: 11/016,247

(22) Filed: Dec. 20, 2004

(65) Prior Publication Data

US 2005/0221740 A1    Oct. 6, 2005

(30) Foreign Application Priority Data

Dec. 23, 2003    (KR)    .................. 10-2003-0095618

(51) Int. Cl.
*B24B 47/02*    (2006.01)

(52) U.S. Cl. .............. 451/336; 451/397; 451/402; 451/451; 198/867.14

(58) Field of Classification Search .............. 451/336, 451/397, 398, 402, 451, 393, 394; 198/394, 198/400, 867.11, 867.14

See application file for complete search history.

(56) References Cited

U.S. PATENT DOCUMENTS

| | | | | |
|---|---|---|---|---|
| 4,457,419 A | * | 7/1984 | Ogami et al. | ............ 198/345.1 |
| 6,527,630 B2 | * | 3/2003 | Mannsperger et al. | ...... 451/344 |
| 6,688,349 B2 | * | 2/2004 | Roshilavati Razlan et al. | ................ 144/154.5 |
| 2004/0147209 A1 | * | 7/2004 | Bickford et al. | ............ 451/451 |
| 2005/0227595 A1 | * | 10/2005 | Marquardt et al. | ......... 451/285 |
| 2006/0199478 A1 | * | 9/2006 | Isobe et al. | ................... 451/54 |

FOREIGN PATENT DOCUMENTS

| KR | 000020758 A | 4/2000 |
|---|---|---|
| KR | 2001-0088425 A | 9/2001 |

* cited by examiner

*Primary Examiner*—Eileen P. Morgan
(74) *Attorney, Agent, or Firm*—Volentine & Whitt, PLLC

(57) ABSTRACT

The present invention is directed to a wafer holder and a related wafer conveyor system. The wafer holder holds a wafer and moves horizontally within a chamber. A contact area between the wafer and the wafer holder is reduced, and potential contaminants generated by ear between components of the wafer holder are trapped by an airtight cover. Since the wafer holder moves horizontally while being fixed to a guide rail, the wafer conveyor system reduces friction between the guide rail and the wafer holder.

13 Claims, 6 Drawing Sheets

WAFER HOLDER AND WAFER CONVEYOR SYSTEM EQUIPPED WITH THE SAME

BACKGROUND OF THE INVENTION

1. Field of the Invention

The present invention generally relates to an apparatus for use in a semiconductor fabricating process. More specifically, the present invention relates to a wafer holder and a wafer conveyor system equipped with the wafer holder.

A claim of priority is made to Korean Patent Application No. 2003-95618 filed on Dec. 23, 2003, the disclosure of which is incorporated herein by reference in its entirety.

2. Description of Related Art

In a conventional semiconductor fabricating process, an integrated circuit device is fabricated by forming a pattern on a semiconductor wafer, and monitoring the pattern-formed wafer. From a preparation area, a wafer is transferred to an operating area for fabrication and testing. The wafer is placed on an apparatus with its pattern-formed front side or back side facing up depending on the configuration of the fabricating apparatus or the test apparatus. When the wafer's front side is facing down, edges of the wafer is supported by a wafer holder.

As shown in FIG. 1 and FIG. 2, a wafer 18 disposed on a wafer holder (not shown) and in a preparation area of a chamber 10 is safely transferred to an operation area 18'. A wafer-input opening 14 adapted to load wafer 18 into chamber 10 is formed over the preparation area; a test apparatus 12 adapted to monitor the surface of wafer 18 is installed under the operation area.

FIG. 2 shows a conventional wafer conveyor system having a pair of parallel guide rails 20 adapted to linearly move a wafer holder. A thread 20a is formed on a surface of the respective guide rails 20. A wafer holder 25 is disposed between guide rails 20. A base plate 24 of wafer holder 25 has sawtooth-shaped protrusions 24a located where base plate 24 and guide rail 20 come in contact. As guide rails 20 rotate, the sawtooth-shaped protrusions 24a move in conjunction with thread 20a. Thus, wafer holder 25 transfers back and forth between the preparation area and the operation area.

Disposed about its center, base plate 24 has a hollow section 40. A rotatable supporter ring 26 is provided in hollow section 40. In the conventional art, a cylindrical roller 30 and a shaft 22 function as a rotating means. Cylindrical roller 30 is horizontally disposed on base plate 24 along the outer perimeter of supporter ring 26. Shaft 22 is connected along a pivot to rotate roller 30. Roller 30 is also threaded.

FIG. 3 illustrates in some additional detail the conventional wafer holder 25. Wafer holder 25 includes supporter ring 26 and a wafer guide ring 28. Supporter ring 26 is disposed in hollow section 40, and wafer guide ring 28 is disposed inside supporter ring 26. A portion of supporter ring 26 is buried in base plate 24, but sawtooth-shaped protrusions 26a protrude from base plate 24. Sawtooth-shaped protrusions 26a engage the thread of roller 30. When roller 30 rotates by the driving action of shaft 22, the thread of roller 30 engages the sawtooth-shaped protrusions 26a to rotate supporter ring 26. A liner 34 is formed along the inner wall of wafer guide ring 28. The outer edge of wafer 18 is supported by liner 34. The pattern-formed side of wafer 18 faces down on liner 34.

In the conventional wafer conveyor system, when guide rail 20 rotates, sawtooth-shaped protrusions 24a move along thread 20a. Since the movement of wafer holder 25 is perpendicular to the rotational direction of guide rail 20, friction between the sawtooth-shaped protrusions 24a and thread 20a causes the respective parts to wear out. If a part is worn out, time is lost in production when the worn out part is maintained or replaced. Furthermore, frictional wear in a system operating within a clean room environment may further cause particle contamination. If metallic particles become attached to a wafer surface, an integrated circuit device formed on the wafer may become defective, or the entire fabrication process may become contaminated.

SUMMARY OF THE INVENTION

In one aspect, the present invention provides a wafer holder to safely support a wafer while reducing the contact area with the wafer.

In another aspect, the preset invention provides a wafer holder which reduces potential contamination of the wafer.

In still another aspect, the present invention provides a wafer conveyor system capable of reducing potential contamination of the wafer.

In order to achieve these aspects, the present invention provides a wafer holder reducing an area of contact between the wafer holder and the wafer. The wafer holder comprises a base plate, a rotatable cylindrical roller, a supporter ring, and a wafer guide ring. The base plate has a circular hollow part and ring-shaped grooves formed along edges of a circular hollow part. The cylindrical roller is adjacent to an outer side of the guide groove to be horizontally installed at the base plate. A thread is formed at a circumferential surface of the cylindrical roller, and a shaft hole is formed at a shaft of the cylindrical hole. The supporter ring is inserted into the guide groove to expose a circumferential surface of the supporter ring to an upper portion of the base plate. Sawtooth-shaped protrusions are formed along the exposed circumferential surface of the supporter ring to gear with the thread of the cylindrical roller. The wafer guide ring is attachably/removably mounted on the supporter ring. A plurality of pads are formed at an inner circumferential surface of the wafer guide ring to support the wafer's edge.

The wafer holder may further comprise a cover to prevent particles generated by abrasion of components (or parts) from being scattered. The cover is combined with the base plate to seal the sawtooth-shaped protrusions and cylindrical roller combination from the outside. A hole corresponding to the shaft hole is formed at the cover, so that the cylindrical roller is driven using the shaft. The shaft is connected to the cylindrical roller through the hole of the cover.

According to another aspect of the present invention, the present invention provides a wafer conveyor system for conveying a wafer in a chamber. The wafer conveyor system comprises driving rollers and passive roller oppositely disposed at both sides of the chamber with a regular space and first and second rails whose inner surface are in contact with the respective driving rollers and passive roller. The first and second rails are oppositely disposed and drive in the same direction. A wafer holder disposed between the first and second guide rails. The first and second guide rails are connected to both sides of the wafer holder to allow the wafer holder to move in parallel with the driving direction of the first and second rails.

DETAILED DESCRIPTION OF THE INVENTION

Figure 1:
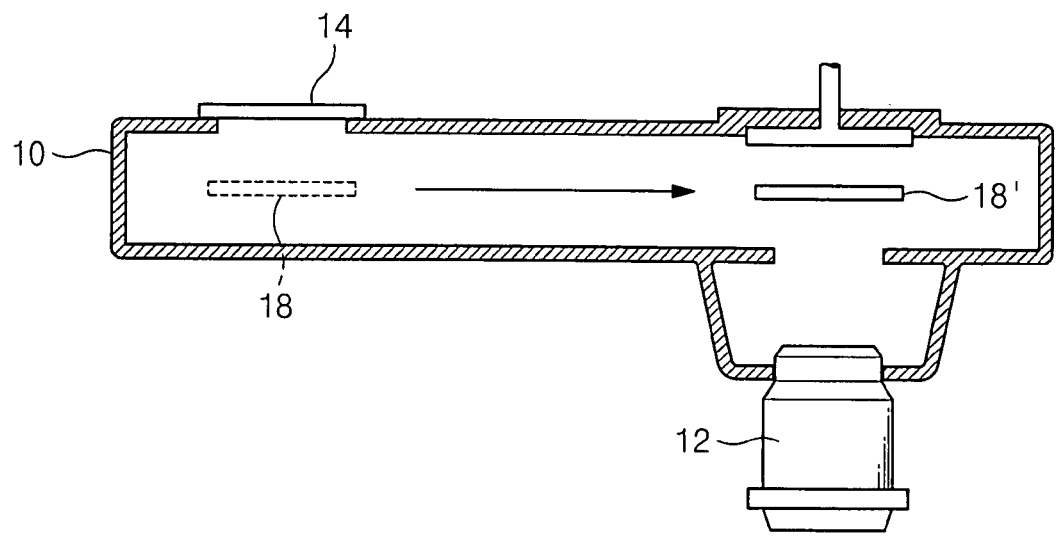
FIG. 1 shows a conventional fabrication process system having a wafer conveyor system.
Figure 2:
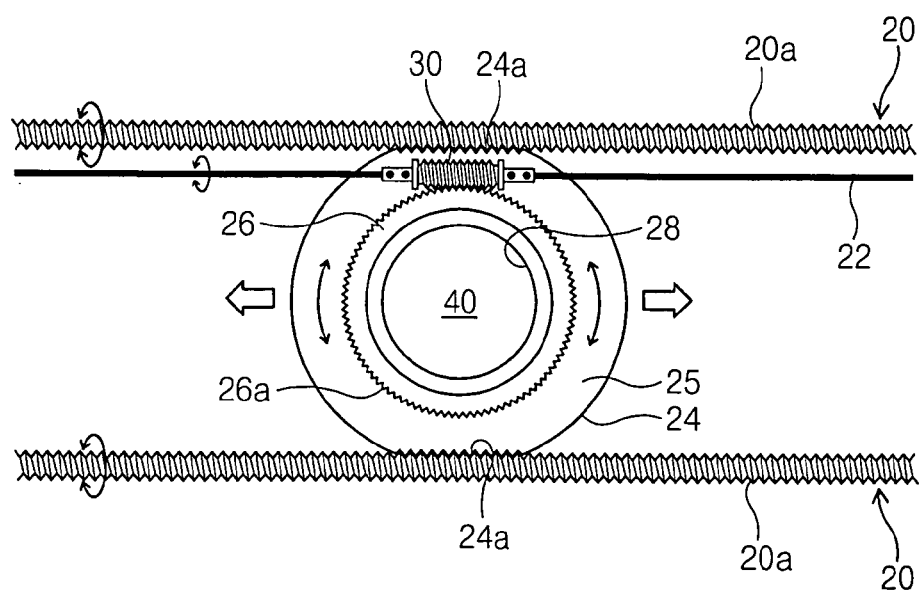
FIG. 2 shows a conventional wafer conveyor system.
Figure 3:
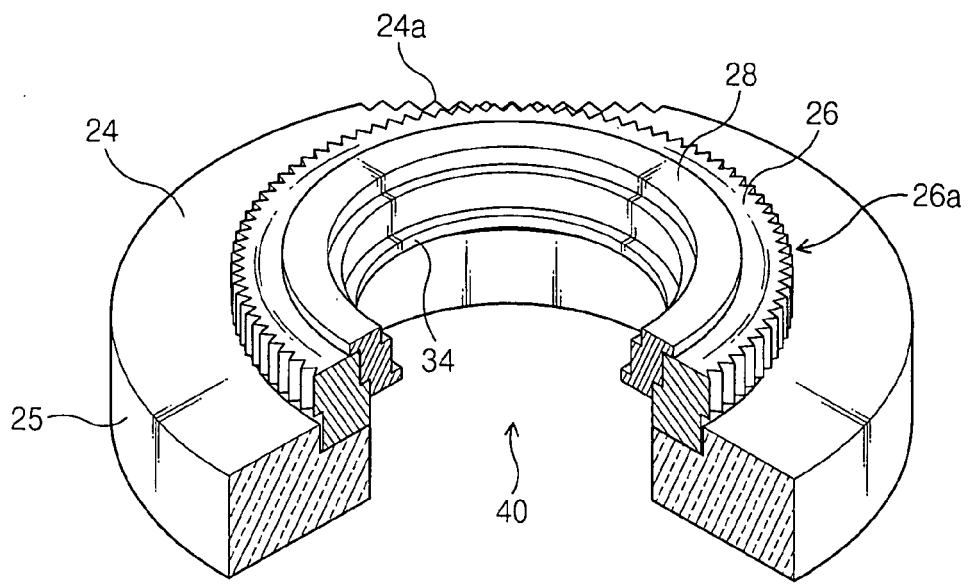
FIG. 3 is a detail perspective view of a conventional wafer holder.
Figure 4:
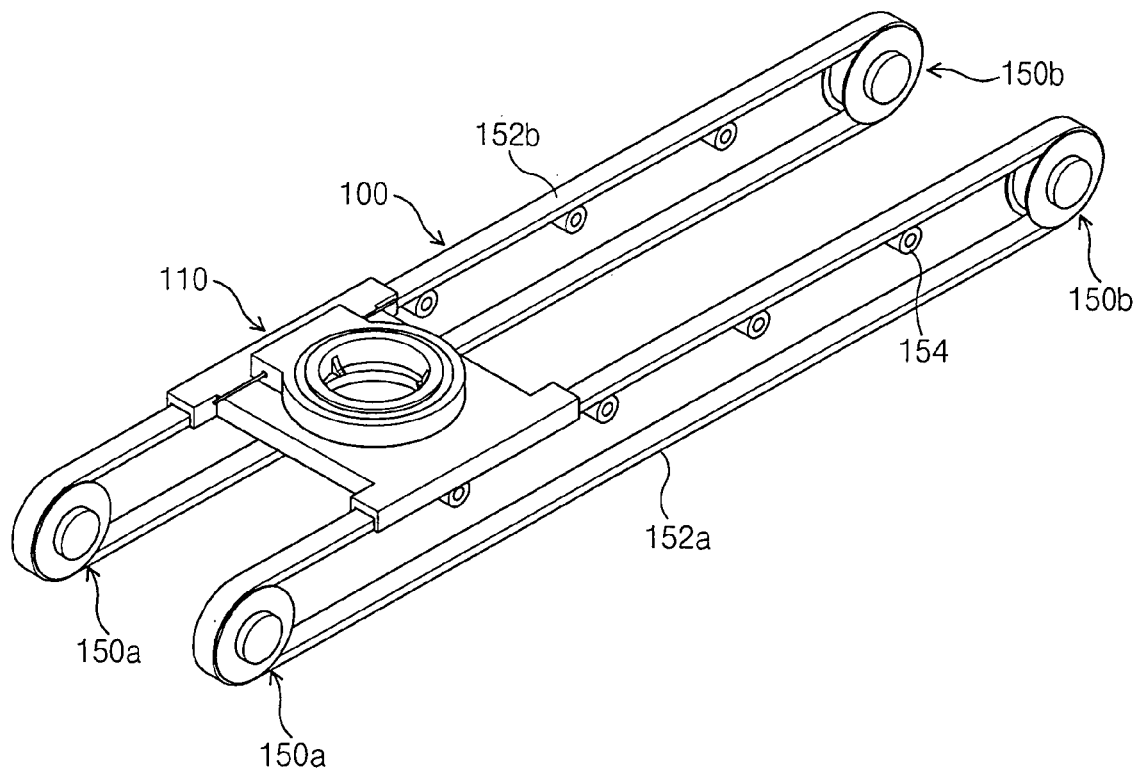
FIG. 4 shows a wafer conveyor system according to a preferred embodiment of the present invention.

A wafer conveyor system 100 according to the present invention is illustrated in FIG. 4. Referring to FIG. 4, wafer conveyor system 100 comprises guide rails 152, further comprises a first guide rail 152a and a second guide 152b. A set of driving rollers 150a and a set of passive rollers 150b are spaced apart from each other, with each set having one roller disposed in relation to the first guide rail 152a and second guide rail 152b, respectively. The inner portion of guide rails 152a, 152b contacts and wraps around driving roller 150a and passive roller 150b.

A wafer holder 110 is disposed between first and second guide rails 152a, 152b, and horizontally moves within a chamber in response to the movement of guide rails 152a, 152b. Namely, wafer holder 110 is transferred between a preparation area and an operation area on conveyor system 100.

Wafer conveyor system 100 optionally comprises a plurality of sub-rollers 154 installed between respective combinations of driving roller 150a and passive roller 150b. Sub-rollers 154 help prevent guide rails 152a, 152b from sagging, thus assisting in the safe movement of wafer holder 110. Although not illustrated, guide rails 152a, 152b are preferably flexible, except at those areas where the wafer holder 110 is fixed thereto.

Wafer holder 110 according to the present invention is fixed to guide rails 152a, 152b. Therefore, contamination generated by wear of guide rails 152a, 152b and wafer holder 110 is minimized.

Figure 5:
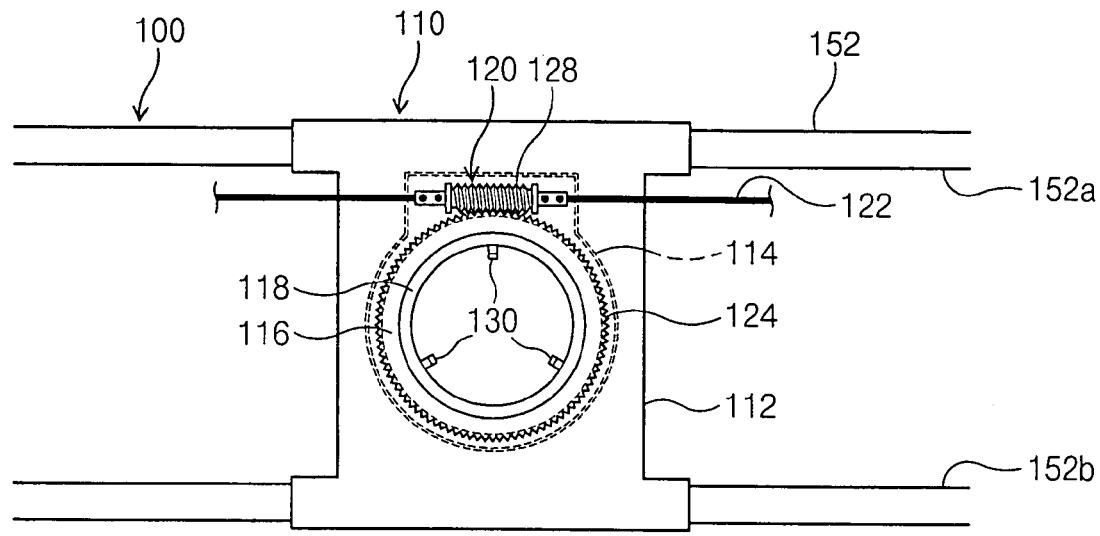
FIG. 5 is a top plan view of a wafer conveyor system according to an embodiment of the present invention.
Figure 6:
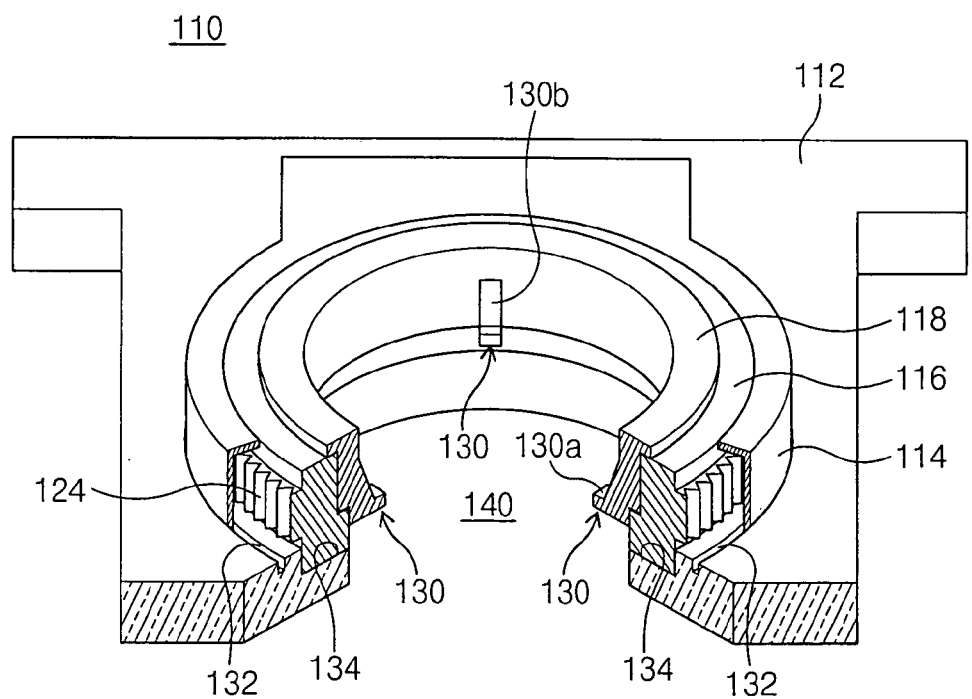
FIG. 6 is a detail perspective view of the wafer holder according to an embodiment of the present invention.
Figure 7:
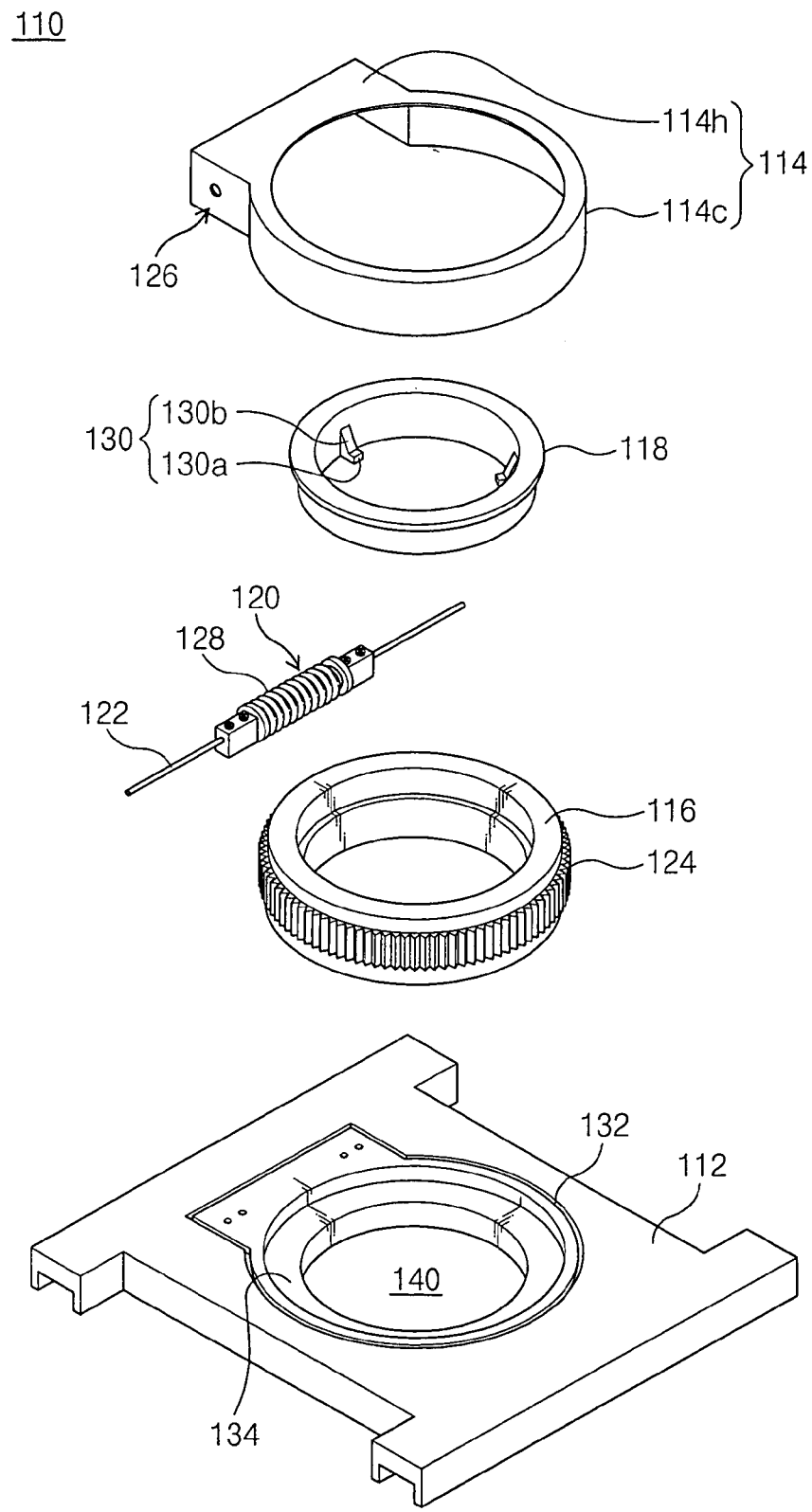
FIG. 7 is an exploded view of the wafer holder according to an embodiment of the present invention.

Referring to FIG. 5, FIG. 6, and FIG. 7, wafer holder 110 includes a base plate 112, a supporter ring 116, and a guide ring 118 mounted on an inner portion of the supporter ring 116. Base plate 112 is mounted on guide rails 152a, 152b. About its center, base plate 112 has a hollow section 140. A ring-shaped guide groove 134 is formed in base plate 112. Supporter ring 116 is inserted into guide groove 134. Sawtooth-shaped protrusions 124 protrude from supporter ring 116 over base plate 112. Supporter ring 116 rotates along guide groove 134.

A cylindrical roller 120 is combined with base plate 112. A thread 128 is formed on a circumferential surface of cylindrical roller 120. Cylindrical roller 120 rotates on a shaft 122, which is horizontally combined with base plate 112. Rotation of cylindrical roller 120 enables thread 128 to engage sawtooth-shaped protrusions 124, thus rotating supporter ring 116. A rotation angle of supporter ring 116 is regulated according to the number of rotations for roller 120.

A removable wafer guide ring 118 is engaged with supporter ring 116. A plurality of pads 130, which support edges of a wafer, are arranged along an inner circumferential surface of guide ring 118. Pads 130 further comprise a supporter 130a to support the wafer's edge, and a slide 130b to safely guide the wafer onto supporter 130a. Guide ring 118 is in contact with the wafer's edge via pads 130; therefore, pads 130 prevent materials on edges of a wafer from falling out, because the wafer is not in direct contact with guide ring 116. In the present invention, supporter ring 116 and cylindrical roller 120 are capsulated by a cover 114. Cover 114 also prevents contaminants from scattering when sawtooth-shaped protrusions 124 and thread 128 mechanically wear. Cover 114 preferably has a ring-shaped section 114c, which covers supporter ring 116, and a housing section 114h, which extends from ring-shaped section 114c to cover cylindrical roller 120. (See FIG. 7). A cover groove 132 is formed on base plate 112 to secure cover 114. An insertion hole 126, wherein shaft 122 of roller 120 is inserted, is formed in housing section 114h. Roller 120 slides along shaft 122.

Figure 8:
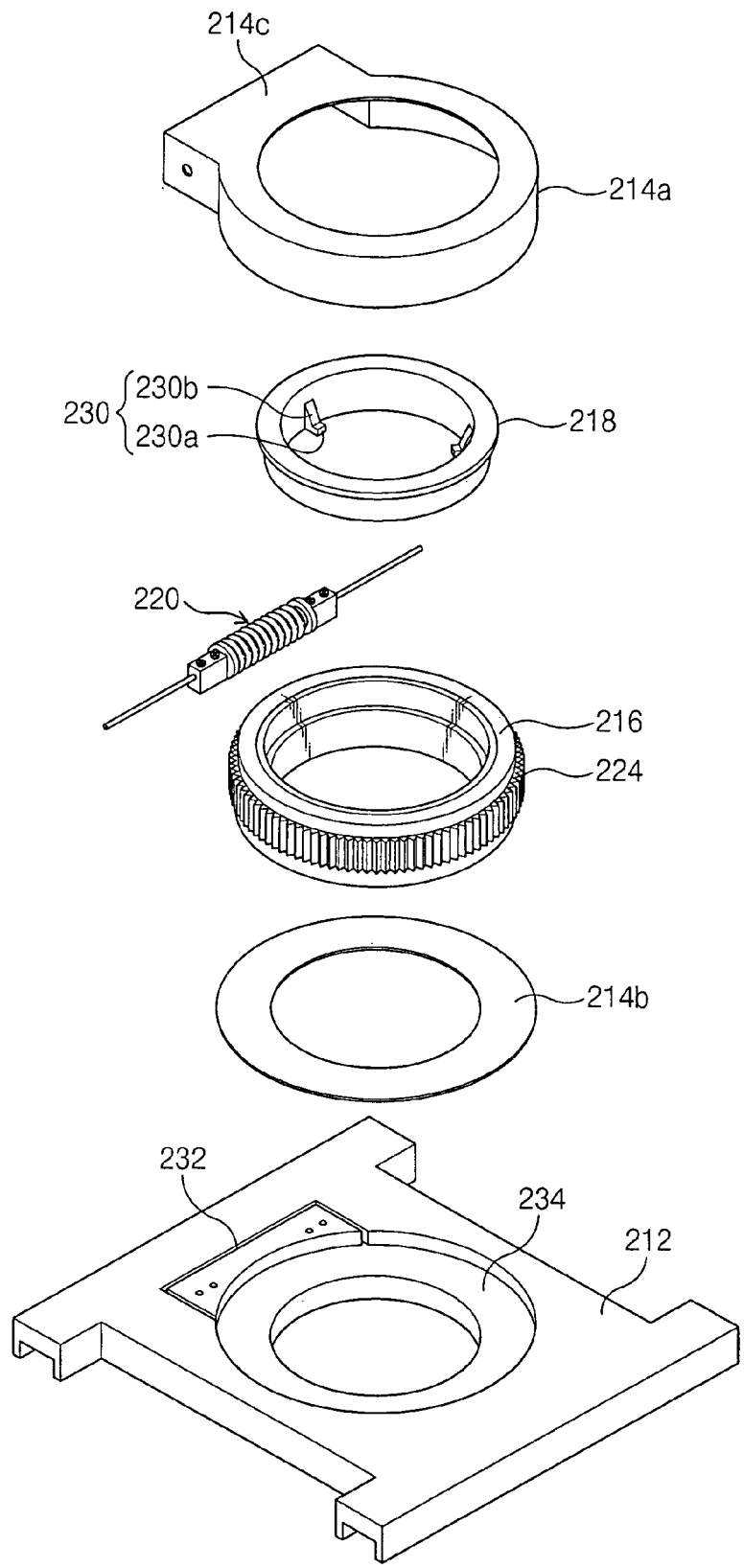
FIG. 8 is an exploded view of a wafer holder according to another embodiment of the present invention.
Figure 9:
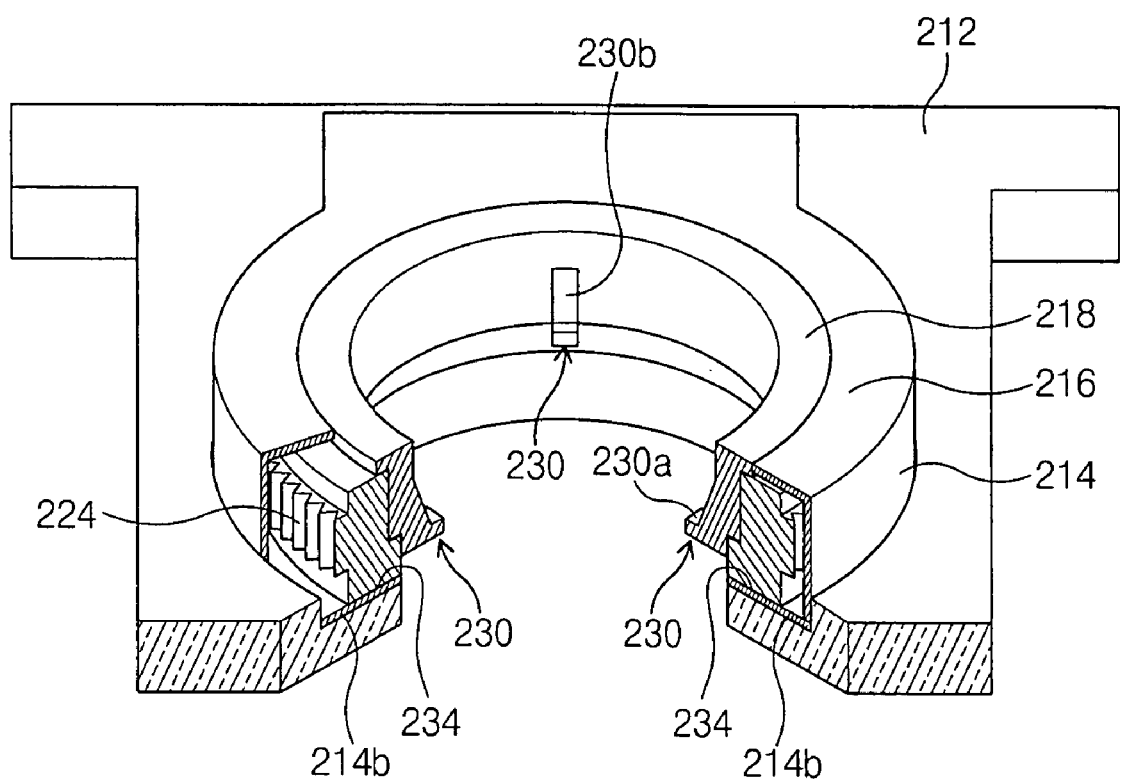
FIG. 9 is a detail perspective view of the wafer holder of FIG. 8.

FIG. 8 is an exploded view of a wafer holder 210 according to a second embodiment of the present invention. FIG. 9 is a perspective view of wafer holder 210 according to the second embodiment of the present invention.

Referring to FIG. 8 and FIG. 9, wafer holder 210 according to the second embodiment of the invention includes a supporter ring 216, and a cover 214. Cover 214 preferably comprises a ring-shaped section 214a to cover supporter ring 216, and a housing section 214c, which extends from ring-shaped section 214a. A cap 214b is inserted between a base plate 212 and supporter ring 216. Housing section 214c covers supporter ring 216, and extends over and covers sawtooth-shaped protrusions 224. Cover 214 and a supporter ring 218 are inserted into a guide grove 234, which is formed in base plate 212. Cover 214 is fixed to guide groove 234. Supporter ring 216 rotates in conjunction with the rotation of a cylindrical roller 220. Base plate 212 has a cover groove 232 where housing section 214c is inserted therein. Cover groove 232 extends from guide groove 234 to surround a portion containing cylindrical roller 220. Thus when roller 220 is combined with base plate 212, housing section 214c is combined with groove 232 to cover roller 220. A thread 228 of roller 220 engages sawtooth-shaped protrusions 224 of supporter ring 216.

A removable wafer guide ring 218 engages with supporter ring 216. A plurality of pads 230 for supporting a wafer's edge are installed on an inner circumferential surface of guide ring 218. Pads 230 further comprise a supporter 230a to support the wafer's edge, and a slide 230b to safely guide the wafer onto supporter 230a.

A wafer is supported by pads 230 of guide ring 218. Thus, the contact area between the wafer and wafer holder 210 is reduced, thus preventing materials on the wafer from falling down. Slide 230b corrects misaligned wafers by guiding the wafers into the correct position along slide 230b onto supporter 230b. Wafer holder 210 rotates a wafer in conjunction with cylindrical roller 220 and supporter ring 216. Supporter ring 216 and cylindrical roller 220 are sealed from the outside by cover 214. Cover 214 prevents contaminants from scattering from supporter ring 216 and cylindrical roller 220.

While the present invention has been described in detail with reference to the presently preferred embodiments, those skilled in the art will appreciate that various modifications may be made without departing from the scope of the invention. Accordingly, the invention is defined by the following claims.

What is claimed is:

1. A wafer holder comprising:
    a base plate having a guide groove formed around a centrally located hollow section;
    a threaded cylindrical roller installed on the base plate adjacent to the guide groove;
    a supporter ring having sawtooth-shaped protrusions provided in the guide groove, wherein the sawtooth-shaped protrusions engage the threaded cylindrical roller;
    a wafer guide ring mounted in the supporter ring; and
    a cover integrally installed on the base plate to cover the sawtooth-shaped protrusions of the supporter ring and the threaded cylindrical roller.

2. The wafer holder of claim 1, further comprising a plurality of pads formed on an inner surface of the wafer guide ring and adapted to receive and support a wafer.

3. The wafer holder of claim 2, wherein the plurality of pads further comprises:
    a supporter adapted to support an edge of the received wafer; and
    a slide to guide the wafer into position on the supporter.

4. The wafer holder of claim 1, wherein the base plate further comprises a cover groove formed around the hollow section and adapted to receive a edge of the installed cover.

5. The wafer holder of claim 1, wherein the cover completely covers the operative combination of the supporter ring and the threaded cylindrical roller.

6. The wafer holder of claim 5, further comprising a cap inserted between the cover groove and the supporter ring.

7. The wafer holder of claim 1, wherein the wafer guide ring is removable from the supporter ring.

8. The wafer holder of claim 1, wherein the base plate is adapted for mounting onto at least one guide rail.

9. A wafer holder comprising:
    a base plate having a hollow section therein and a guide groove formed along an edge of the hollow section;
    a cylindrical roller installed on the base plate adjacent to the guide groove, wherein the cylindrical roller is threaded;
    a supporter ring having sawtooth-shaped protrusions provided in the guide groove, wherein the sawtooth-shaped protrusions engage the thread of the cylindrical roller;
    a wafer guide ring mounted in the supporter ring;
    a plurality of pads formed along an inner surface of the wafer guide ring, pad comprising a supporter having a horizontal upper surface adapted to support an edge of a wafer and a slide having a sloped upper surface extending to the horizontal upper surface of the supporter adapted to guide the wafer into a position on the supporter.

10. The wafer holder of claim 9, further comprising a cover to protect the sawtooth-shaped protrusions and the cylindrical roller.

11. The wafer holder of claim 10, further comprising a cover to protect the supporter ring and the cylindrical roller.

12. The wafer holder of claim 10, wherein the base plate further comprises a cover groove formed at an upper portion of the base plate and surrounding the circular hollow section, wherein the cover is inserted into the ring-shaped cover groove.

13. The wafer holder of claim 11, wherein a cap is inserted between the cover groove and the supporter ring.

* * * * *